US008991461B2

(12) United States Patent
Kim

(10) Patent No.: US 8,991,461 B2
(45) Date of Patent: Mar. 31, 2015

(54) FILM LAMINATION APPARATUS AND METHOD OF MANUFACTURING ORGANIC LIGHT-EMITTING DISPLAY APPARATUS USING THE FILM LAMINATION APPARATUS

(71) Applicant: Samsung Display Co., Ltd., Yongin-si, Gyeonggi-do (KR)

(72) Inventor: Hak-Min Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 13/778,052

(22) Filed: Feb. 26, 2013

(65) Prior Publication Data

US 2014/0113394 A1 Apr. 24, 2014

(30) Foreign Application Priority Data

Oct. 18, 2012 (KR) .................. 10-2012-0116074

(51) Int. Cl.
*B29C 65/48* (2006.01)
*B32B 37/00* (2006.01)
*B32B 41/00* (2006.01)
*B65H 29/24* (2006.01)
(Continued)

(52) U.S. Cl.
CPC ................ *H01L 51/56* (2013.01); *B32B 37/00* (2013.01); *B32B 38/1833* (2013.01); *B32B 38/1858* (2013.01); *B32B 2038/1891* (2013.01); *B32B 2457/206* (2013.01)
USPC ............................ 156/538; 156/539; 156/556

(58) Field of Classification Search
CPC .... B32B 37/00; B32B 37/10; B32B 37/1009; B32B 37/12; B32B 38/1833; B32B 38/1858; B32B 2457/08; B32B 2457/206; C08J 5/12; C08J 5/124

USPC ................. 156/60, 228, 307.1, 307.3, 307.5, 156/307.7, 538, 539, 556; 225/96.5; 414/763

See application file for complete search history.

(56) References Cited

U.S. PATENT DOCUMENTS 6,235,634 B1 5/2001 White et al.
8,790,480 B2 * 7/2014 Hirata et al. .................. 156/249
2002/0157691 A1 10/2002 Wada
(Continued)

FOREIGN PATENT DOCUMENTS

JP  10264071 A * 10/1998 ............... B25J 15/08
JP  2008-28208 A  2/2008
(Continued)

OTHER PUBLICATIONS

English Abstract of JP 10-264071 (Apr. 3, 2004).*
(Continued)

*Primary Examiner* — Sing P Chan
(74) *Attorney, Agent, or Firm* — Christie, Parker & Hale, LLP

(57) ABSTRACT

A film lamination apparatus for laminating a film on a flat display panel including a display unit on one surface of a substrate, the film lamination apparatus including: a work table configured to support the flat display panel such that the display unit is below the substrate; and a transfer robot configured to support the flat display panel such that the display unit faces upward and then transfer the flat display panel to the work table while the flat display panel is turned over such that the display unit faces downward.

29 Claims, 7 Drawing Sheets

(51) Int. Cl.
    *H01L 51/56*     (2006.01)
    *B32B 38/18*     (2006.01)

(56) References Cited

U.S. PATENT DOCUMENTS

| 2008/0017322 | A1 | 1/2008 | Mitsumoto et al. | |
|---|---|---|---|---|
| 2013/0291593 | A1* | 1/2013 | Kato et al. | 65/29.12 |
| 2013/0081751 | A1* | 4/2013 | Kokaji et al. | 156/64 |

FOREIGN PATENT DOCUMENTS

| KR | 2007072105 A | * | 7/2007 | ............ B25J 18/00 |
|---|---|---|---|---|
| WO | WO 01/73840 A1 | | 10/2001 | |

OTHER PUBLICATIONS

Machine Translation of JP 10-264071 (Aug. 22, 2014).*

Machine Translation of KR10-2007-0072105 (Aug. 22, 2014).*

* cited by examiner

FILM LAMINATION APPARATUS AND METHOD OF MANUFACTURING ORGANIC LIGHT-EMITTING DISPLAY APPARATUS USING THE FILM LAMINATION APPARATUS

CROSS-REFERENCE TO RELATED APPLICATION

This application claims priority to and the benefit of Korean Patent Application No. 10-2012-0116074, filed on Oct. 18, 2012 in the Korean Intellectual Property Office, the entire content of which is incorporated herein by reference.

BACKGROUND

1. Field

Aspects of embodiments of the present invention relate to a film lamination apparatus and a method of manufacturing an organic light-emitting display apparatus using the film lamination apparatus.

2. Description of the Related Art

An organic light-emitting display apparatus is a self-emissive display apparatus that has wide viewing angles, excellent contrast, and quick response speeds, and thus, the organic light-emitting display apparatus is receiving attention as a next-generation display apparatus. The organic light-emitting display apparatus may include an intermediate layer, a first electrode, and a second electrode. The intermediate layer may include an organic light-emitting layer that emits visible light when voltages are applied to the first and second electrodes.

SUMMARY

According to aspects of embodiments of the present invention, a film lamination apparatus for preventing damage to a display unit of a flat display panel while laminating a film on the display unit, and a method of manufacturing an organic light-emitting display apparatus using the film lamination apparatus are provided.

According to an aspect of the present invention, there is provided a film lamination apparatus for laminating a film on a flat display panel including a display unit on one surface of a substrate, the film lamination apparatus including: a work table configured to support the flat display panel such that the display unit is below the substrate; and a transfer robot configured to support the flat display panel such that the display unit faces upward and to transfer the flat display panel to the work table while the flat display panel is turned over such that the display unit faces downward.

The transfer robot may include: an arm including a plurality of support bars spaced apart from each other and a connector connecting the support bars together at one side of the support bars; a joint member connected to the arm, the joint member being configured to change a position of the arm; and first adhesion members on a side of the support bars where the flat display panel is configured to be located, the first adhesion members being configured to adhere to the flat display panel.

Intervals between adjacent support bars may be equal.

According to an embodiment of the present invention, the arm is rotatable around the joint member.

When the flat display panel is being located on the arm, the arm may be configured to be located such that the first adhesion members face upward, and after the first adhesion members adhere to the flat display panel on the arm, the arm may be configured to rotate such that the flat display panel faces downward.

The transfer robot may be configured to rotate the arm such that the display unit faces downward and to transfer the flat display panel to the work table.

The joint member may be connected to the connector.

According to one embodiment of the present invention, the joint member is capable of moving the arm up, down, left, or right.

A length direction of each of the plurality of support bars may be perpendicular to a length direction of the connector.

The first adhesion members may include vacuum pads.

The work table may include: a body; a plurality of support ribs on a bottom surface of the body, the support ribs being configured to receive the flat display panel; a plurality of accommodating portions for respectively accommodating the support bars between the support ribs; and second adhesion members on one side of the plurality of support ribs, the second adhesion members being configured to secure the flat display panel transferred by the transfer robot.

A depth of each of the accommodating portions may be larger than a height of each of the plurality of support bars.

Intervals between the support ribs may be larger than widths of the support bars.

The support ribs may be integrally formed with the body. The support ribs may be formed individually from the body and on a bottom surface of the body.

The second adhesion members may be configured to adhere to and secure the flat display panel to the support ribs after the support bars are respectively accommodated in the accommodating portions.

The second adhesion members may be configured to adhere to the substrate of the flat display panel when the display unit faces downward.

The first adhesion members may be configured to release the adhesion with the flat display panel after the second adhesion members adhere to and secure the flat display panel.

The transfer robot may be configured to move such that the support bars are completely out of the accommodating portions after the flat display panel is secured to the work table by the second adhesion members.

The first adhesion members may be configured to adhere to and secure the flat display panel on the arm when the flat display panel is on the plurality of support bars, and to release the adhesion with the flat display panel after the flat display panel is transferred to the work table.

According to another aspect of the present invention, there is provided a method of manufacturing an organic light-emitting display apparatus, the method including: preparing a flat display panel including a display unit on a substrate; securing and supporting the flat display panel using a transfer robot such that the display unit is above the substrate; rotating the flat display panel such that the display unit is below the substrate; securing and supporting the flat display panel to a work table; and laminating a film on the display unit.

The transfer robot may include: an arm including a plurality of support bars spaced apart from each other and a connector connecting the support bars together at one side of the support bars; a joint member connected to the arm and configured to change a position of the arm; and first adhesion members on a side of the support bars where the flat display panel is configured to be located on, the first adhesion members being configured to adhere to the flat display panel.

The securing and supporting of the flat display panel by using the transfer robot may include: positioning the arm such that the first adhesion members face upward; disposing the substrate on the first adhesion members; and securing the flat display panel to the arm by adhering the substrate using the first adhesion members.

The rotating of the flat display panel may include rotating the flat display panel, when the substrate is adhered to the first adhesion members, by using the arm such that the display unit rotates from facing upward to facing downward.

The work table may include: a body; a plurality of support ribs on a bottom surface of the body and on which the flat display panel is to be placed; a plurality of accommodating portions for respectively accommodating the support bars between the support ribs; and second adhesion members on one side of the plurality of support ribs, the second adhesion members being configured to secure the flat display panel transferred by the transfer robot.

A depth of each of the accommodating portions may be larger than a height of each of the support bars.

Intervals between the plurality of support ribs may be larger than widths of the plurality of support bars.

The securing and supporting of the flat display panel to the work table may include: ascending the arm supporting the flat display panel towards the work table with the display unit facing downward; adhering the substrate by using the second adhesion members; releasing the adhesion of the substrate by the first adhesion members; and removing the arm from the accommodating portions.

The ascending of the arm may include ascending the arm until the second adhesion members contact the substrate and the support bars are accommodated in the accommodating portions.

BRIEF DESCRIPTION OF THE DRAWINGS

The above and other features and aspects of the present invention will become more apparent by describing in detail exemplary embodiments thereof with reference to the attached drawings, in which.

DETAILED DESCRIPTION

Hereinafter, embodiments of the present invention will be described in detail with reference to the accompanying drawings.

Figure 1:
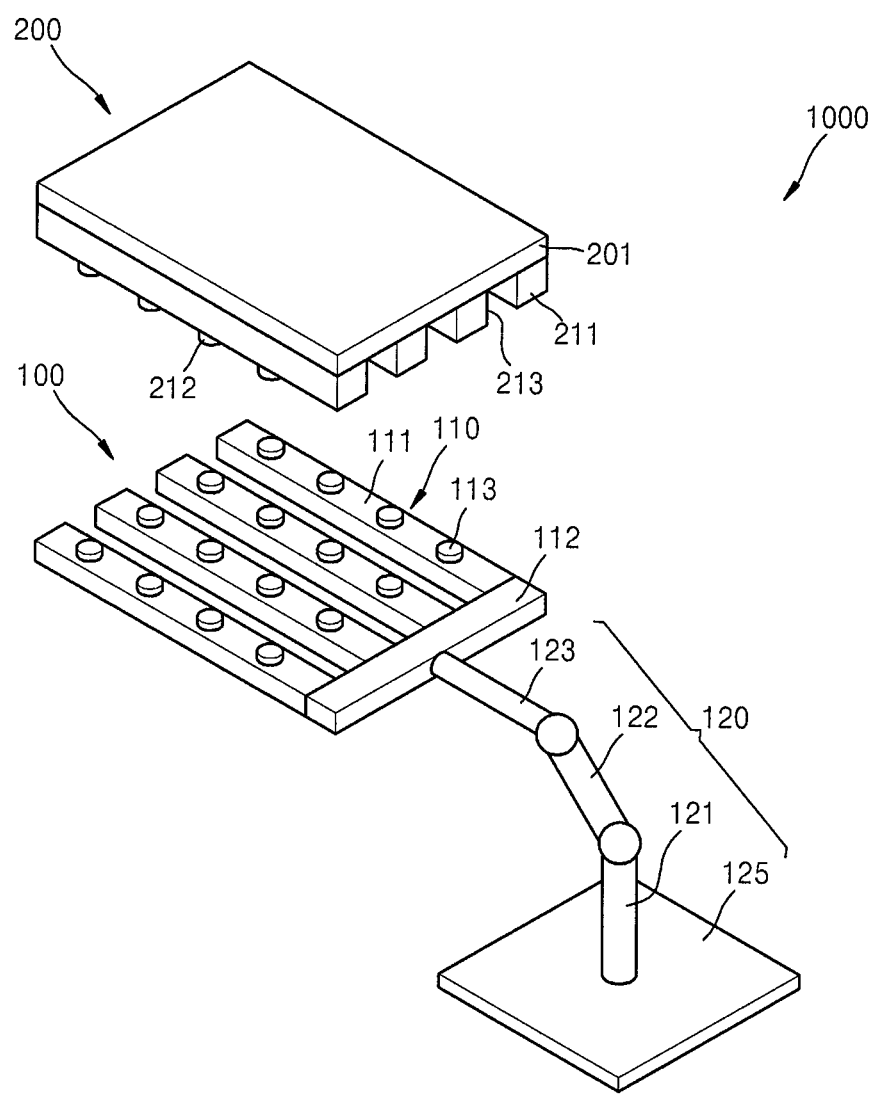
FIG. 1 is a diagram schematically illustrating a film lamination apparatus according to an embodiment of the present invention.

FIG. 1 is a diagram schematically illustrating a film lamination apparatus 1000 according to an embodiment of the present invention.

Referring to FIG. 1, the film lamination apparatus 1000 includes a transfer robot 100 and a work table 200. Here, the transfer robot 100 may include an arm 110, a joint member 120, and a first adhesion member 113. The work table 200 may include a body 201, a support rib 211, a second adhesion member 212, and an accommodation portion 213.

According to one embodiment, the transfer robot 100 receives (and adheres to) a flat display panel from another apparatus, and then transfers the flat display panel to the work table 200.

Figure 2:
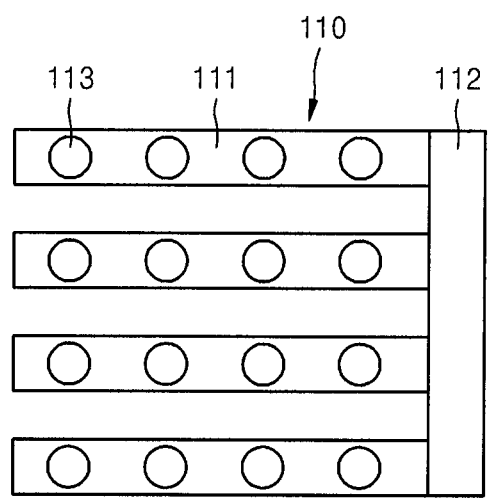
FIG. 2 is a plan view schematically illustrating an arm of the film lamination apparatus of FIG. 1.

FIG. 2 is a plan view schematically illustrating the arm 110 of the film lamination apparatus 1000 of FIG. 1.

Referring to FIGS. 1 and 2, the arm 110 may include a support bar 111, a connector 112, and the first adhesion member 113. The arm 110 may receive, adhere to, and support a flat display panel 10 of FIG. 3.

There may be a plurality of support bars 111. For example, as shown in FIG. 1, there may be four support bars 111. However, the number of support bars 111 is not limited thereto, and may be 2 or more.

The support bars 111 may be spaced apart from each other, and all intervals between the support bars 111 may be equal.

One surface of the support bars 111 may be flat for the flat display panel 10 to be placed thereon. In one embodiment, the support bars 111 may have a rectangular pillar shape. However, shapes of the support bars 111 are not limited thereto, and the support bars 111 may be a polygonal pillar (e.g., a hexagonal pillar) or semicircular pillar having at least one flat surface.

The support bars 111 may be disposed such that corresponding flat surfaces thereof all face the same direction, and the corresponding flat surfaces of the support bars 111 may be in the same plane. Accordingly, the support bars 111 are spaced apart from each other, and the flat display panel 10 may be disposed on the flat surfaces of the support bars 111.

A plurality of first adhesion members 113 may be disposed on the flat surfaces of the support bars 111. The first adhesion members 113 adhere to the flat display panel 10 and fix (or secure) the flat display panel 10 to the support bars 111 of the arm 110. The first adhesion member 113 may be a vacuum pad.

After the flat display panel 10 is fixed to the work table 200 by the transfer robot 100, the first adhesion member(s) 113 may release the adhesion with the flat display panel 10. Accordingly, the arm 110 may be separated from the flat display panel 10. This will be described in detail below.

One of the ends of the support bars 111 may be combined to the connector 112. A lengthwise direction of the connector 112 may be perpendicular to a lengthwise direction of the support bar 111. The plurality of support bars 111 may be spaced apart from each other along the lengthwise direction of the connector 112. The support bars 111 and the connector 112 may be individually formed and then connected to each other, or the support bars 111 may be integrally formed with the connector 112.

The joint member 120 may be connected to the arm 110 to rotate the arm 110, and may move the arm 110 up, down, backward, forward, left, or right.

Figure 5:
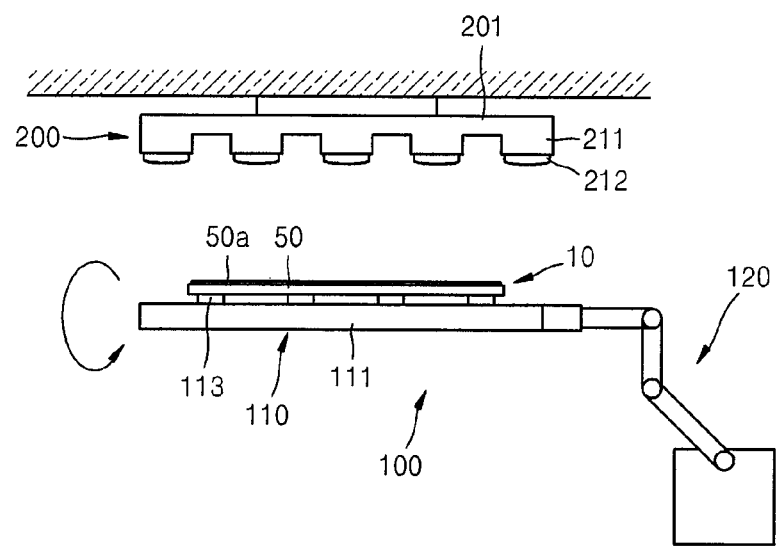
FIGS. 5 through 10 are schematic front, side, or cross-sectional views illustrating processes of laminating a film on a flat display panel.
Figure 6A:
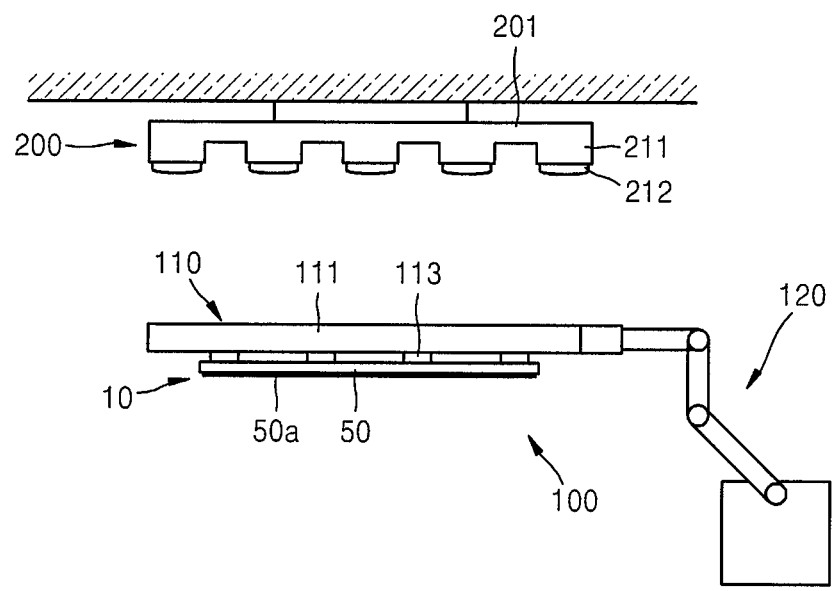

The joint member 120 may include a first member 121, a second member 122, a third member 123, and a fixed member 125. The fixed member 125 may be located on the ground to fix the transfer robot 100 to the ground. One end of the first member 121 may be combined to the fixed member 125, and the other end thereof may be connected to the second member 122. The second member 122 may be connected to the first member 121 to move up, down, left, or right. One end of the third member 123 may be connected to the second member 122, and the other end thereof may be connected to the connector 112 of the arm 110. The third member 123 may move up, down, left, or right around the second member 122. The connector 112 may be connected to the third member 123 to be rotatable, and thus the arm 110 is rotatable around the third member 123. In other words, as shown in FIG. 5, the arm 110 may hold the first adhesion member 113 to face upward and may rotate around the third member 123 such that the first adhesion member 113 faces downward as shown in FIG. 6a.

The work table 200 may include the body 201, the accommodation portion 213 (see FIGS. 1 and 4), the second adhesion member 212, and the support rib 211. The work table 200 adheres to and fixes the flat display panel 10 transferred by the transfer robot 100, and supports the flat display panel 10 while laminating a film on the flat display panel 10.

The support ribs 211 are disposed on a bottom surface of the body 201. The support ribs 211 are spaced apart from each other on the bottom surface of the body 201, and intervals between the support ribs 211 may be equal. The intervals between the support ribs 211 may be larger than widths of the support bars 111.

Figure 4:
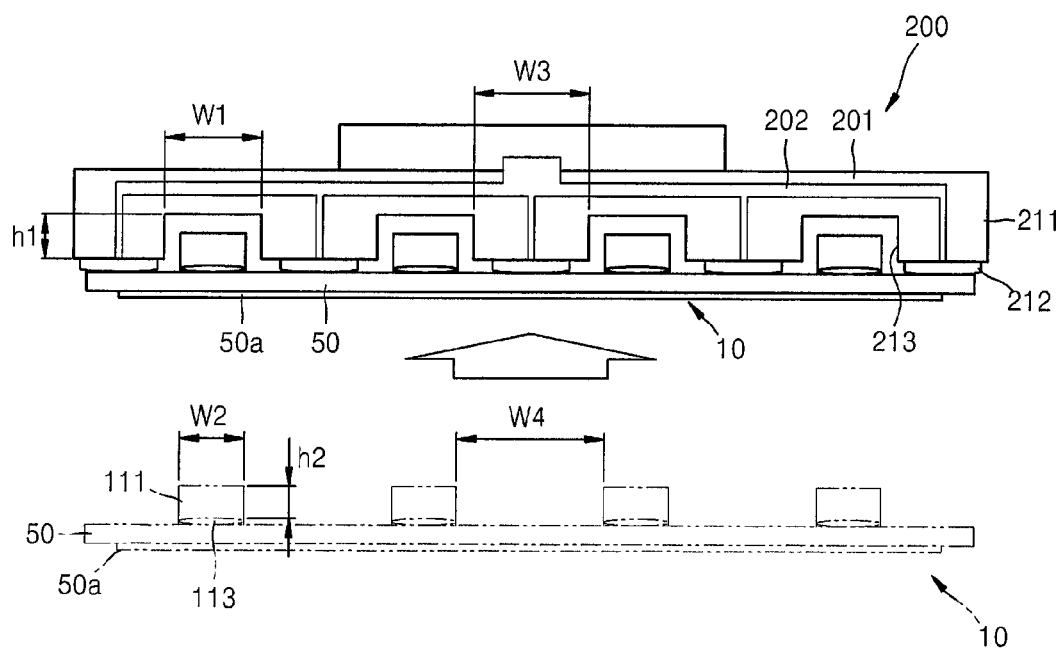
FIG. 4 is a cross-sectional view schematically illustrating a process of transferring a flat display panel to a work table by a transfer robot.

One of the surfaces of the support ribs 211 may be flat for the flat display panel 10 to be placed thereon. As shown in FIGS. 1 and 4, the support ribs 211 may have a pillar shape (e.g., a rectangular or hexagonal pillar shape). One surface of the pillar shaped support ribs 211 may be combined to the body 201, and the flat display panel 10 may be placed on another surface thereof (e.g., an opposite surface). However, a shape of the support rib 211 is not limited thereto, for example, the support rib 211 may be any polygonal pillar having at least one flat surface.

The support ribs 211 may be disposed parallel to each other in a length direction on the bottom surface of the body 201. Bottom surfaces of the support ribs 211 facing down (e.g., the ground) may all be disposed on the same virtual plane. Accordingly, the flat display panel 10 may be disposed on the bottom surfaces of the support ribs 211.

The second adhesion member 212 may be disposed on the bottom surfaces of the support ribs 211. In one embodiment, a plurality of the second adhesion members 212 may be respectively disposed on the bottom surfaces of the support ribs 211.

The second adhesion members 212 adhere to and fix the flat display panel 10 disposed on the bottom surfaces of the support ribs 211 to the work table 200. The second adhesion member 212 may be, for example, a vacuum pad. Since the second adhesion members 212 adhere to and fix the flat display panel 10, the flat display panel 10 may be prevented from falling (e.g., falling to the ground).

Figure 3:
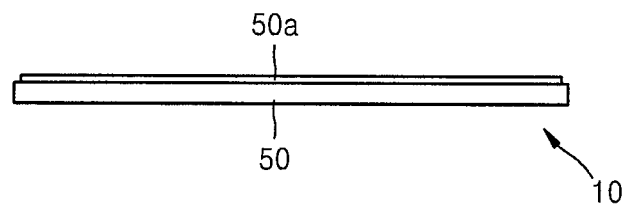
FIG. 3 is a cross-sectional view schematically illustrating a flat display panel.

FIG. 3 is a cross-sectional view schematically illustrating the flat display panel 10.

Referring to FIG. 3, the flat display panel 10 may include a substrate 50 and a display unit 50a.

The display unit 50a including an organic light-emitting device on the substrate 50. The substrate 50 may be formed of not only glass but also any one of various plastics, such as acryl, and moreover, a metal plate. A buffer layer (not shown) may be further disposed on the substrate 50.

The display unit 50a may include a plurality of organic light-emitting devices. The organic light-emitting display device of the display unit 50a may include a pixel electrode, a counter electrode facing the pixel electrode, and an intermediate layer including at least an emission layer between the pixel and counter electrodes. The pixel electrode may be a transparent or reflective electrode. When the pixel electrode is a transparent electrode, the pixel electrode may be formed of indium tin oxide (ITO), indium zinc oxide (IZO), zinc oxide (ZnO), or indium oxide ($In_2O_3$), and when the pixel electrode is a reflective electrode, the pixel electrode may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a film formed of ITO, IZO, ZnO, or $In_2O_3$ thereon. The counter electrode may also be a transparent or reflective electrode. When the counter electrode is a transparent electrode, the counter electrode may include a film where lithium (Li), calcium (Ca), lithium fluoride (LiF)/Ca, LiF/Al, Al, Mg, or a compound thereof faces the intermediate layer between the pixel electrode and the counter electrode, and an auxiliary electrode or bus electrode line formed of a material for forming a transparent electrode, such as ITO, IZO, ZnO, or $In_2O_3$, on the film. When the counter electrode is a reflective electrode, the counter electrode may be formed by depositing Li, Ca, LiF/Ca, LiF/Al, Al, Mg, or a compound thereof. The intermediate layer between the pixel electrode and the counter electrode may be formed of a low molecular weight organic material or a high molecular weight organic material. When a low molecular weight organic material is used, the intermediate layer may be formed in a single or complex structure of a hole injection layer (HIL), a hole transport layer (HTL), an emission layer (EML), an electron transport layer (ETL), and an electron injection layer (EIL). Also, usable organic materials vary, including copper phthalocyanine (CuPc), N,N'-Di(naphthalene-1-yl)-N,N'-diphenyl-benzidine (NPB), and tris-8-hydroxyquinoline aluminum (Alq3). The low molecular weight organic material may be formed by using a vacuum deposition method using masks. When a high molecular weight organic material is used, the intermediate layer may include an HTL and an EML. Here, poly(3,4-ethylenedioxythiophene) (PEDOT) may be used as the HTL and a poly-phenylenevinylene (PPV)- or polyfluorene-based high molecular weight organic material may be used as the EML.

As described above, since the display unit 50a is formed on the substrate 50 the flat display panel 10 has one surface exposing the display unit 50a and the other surface exposing the substrate 50. As shown in FIG. 1, the arm 110 orients the first adhesion member 113 to face upward and locates the substrate 50 such that it is placed on the first adhesion member 113, and the first adhesion member 113 adheres to the substrate 50 to fix the flat display panel 10 to the support bars 111. Since the arm 110 supports the substrate 50 instead of the display unit 50a of the flat display panel 10, the display unit 50a may be prevented from being damaged by the arm 110 while the transfer robot 100 transfers the flat display panel 10.

FIG. 5 is a cross-sectional view illustrating a process of transferring the flat display panel 10 to the work table 200 by the transfer robot 100.

The flat display panel 10 is disposed on the arm 110 where the first adhesion members 113 are disposed on the support bars 111 such that the substrate 50 is adhered by the first adhesion members 113. Here, the flat display panel 10 is disposed such that the display unit 50a faces upward. Then, as shown in FIG. 5, the arm 110 rotates such that the flat display panel 10 is disposed below (e.g., below in the gravity direction) the support bars 111, and at this time, the display unit 50a faces downward (see FIG. 6A).

The transfer robot 100 is disposed below the work table 200 while the flat display panel 10 is turned over, and the flat display panel 10 is transferred to the work table 200. In one embodiment, the transfer robot 100 locates the flat display panel 10 below the work table 200 and then ascends the arm 110 such that the support bars 111 are respectively accommodated in the accommodation portions 213 of the work table 200.

Referring now to FIG. 4, since a depth h1 of the accommodation portion 213 is larger than a thickness h2 of the support bar 111, and a width w1 of the accommodation portion 213 is larger than a width w2 of the support bar 111, the support bar 111 may be accommodated in the accommodation portion 213.

The transfer robot 100 ascends the arm 110 towards the work table 200 until the second adhesion members 212 of the work table 200 contact the substrate 50. The second adhesion member 212 may be a vacuum pad. The second adhesion member 212 adheres to the substrate 50 and fixes the flat display panel 10 to the work table 200.

FIGS. 5 through 10 are schematic front, side, or cross-sectional views illustrating processes of laminating a film on the flat display panel 10.

First, referring to FIG. 5, the flat display panel 10 may be disposed on the arm 110 such that the substrate 50 is below the display unit 50a. The first adhesion members 113 adhere to the substrate 50 to fix the flat display panel 10 on the arm 110. Here, the flat display panel 10 may be disposed such that the display unit 50a faces the work table 200 and the substrate 50 faces the ground.

Figure 6B:
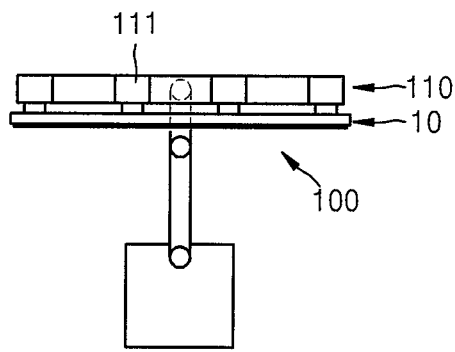
Figure 7A:
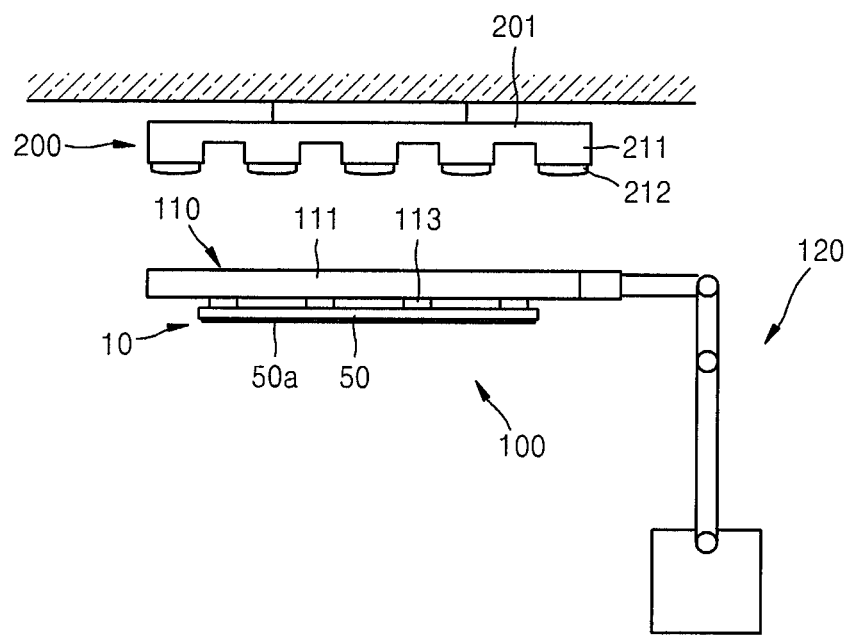
Figure 7B:
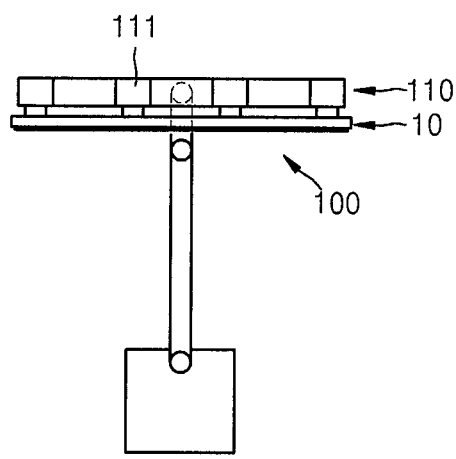

FIGS. 6A and 7A include side views of the transfer robot 100 and FIGS. 6B and 7B are front views of the transfer robot 100.

Referring to FIGS. 6A and 6B, the arm 110 rotates 180° from the position shown in FIG. 5. Accordingly, the flat display panel 10 is disposed such that the display unit 50a faces down (e.g., the ground) and the substrate 50 faces the work table 200. Accordingly to one or more embodiments, since the first adhesion members 113 adhere to the substrate 50, even when the arm 110 rotates 180°, the flat display panel 10 does not fall to the ground.

Then, referring to FIGS. 7A and 7B, the transfer robot 100 ascends the arm 110 to the work table 200 while the arm 110 is rotated 180°.

Figure 8:
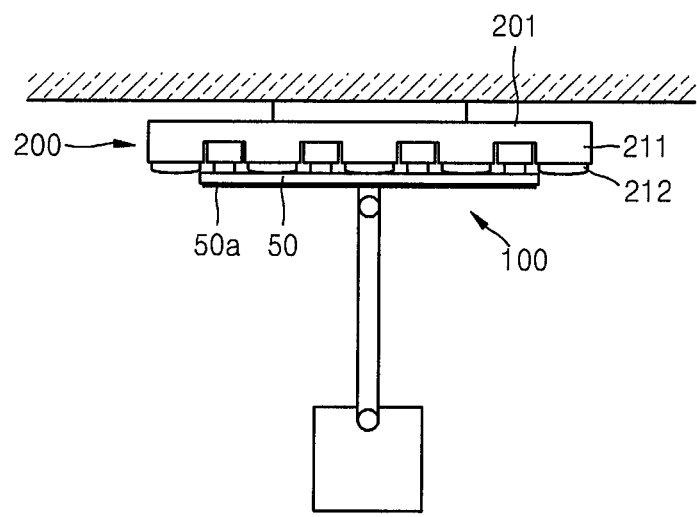

Next, referring to FIG. 8, the transfer robot 100 further ascends the arm 110 to fix the flat display panel 10 to the work table 200. According to one or more embodiments, the transfer robot 100 ascends the arm 110 towards the work table 200 such that the support bars 111 are respectively accommodated in the accommodation portions 213. Here, the transfer robot 100 ascends the arm 110 until the substrate 50 contacts the second adhesion member 212 of the work table 200. The substrate 50 contacting the second adhesion member 212 is adhered to the second adhesion member 212 and fixed to the work table 200.

Figure 9:
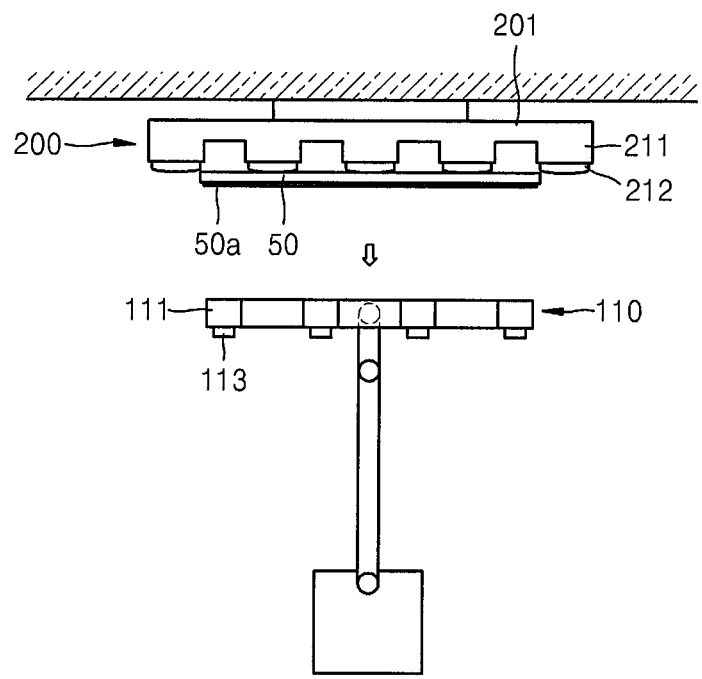

Then, as shown in FIG. 9, the flat display panel 10 is fixed to the work table 200, and the arm 110 is removed from the accommodation portion 213. For example, after the flat display panel 10 is fixed to the work table 200, the adhesion of the substrate 50 is released by the first adhesion member 113 and the substrate 50 is separated from the arm 110. Then, the arm 110 may be removed (or recede) along a length direction of the accommodation portion 213 to be separated from (or out of) the work table 200.

Figure 10:
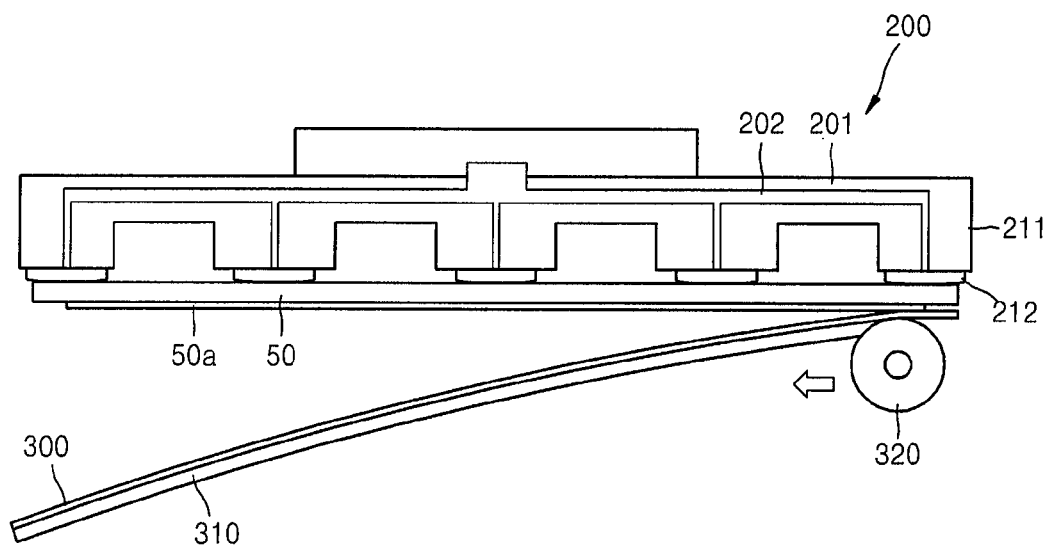

Then, as shown in FIG. 10, a film is laminated on the display unit 50a of the flat display panel 10. According to one or more embodiments, the substrate 50 is adhered to and fixed by the second adhesion member 212 such that the display unit 50a faces down (e.g., the ground). Here, a stage 310 and a film 300 are adhered to one end of the display unit 50a, and the film 300 is laminated on the display unit 50a while a roller 320 presses the film 300 against the display unit 50a. As such, when the film 300 is laminated below the display unit 50a, the film 300 is more tightly maintained to prevent bubbles from generating between the film 300 and the display unit 50a, thereby increasing an adhesion precision of the film 300.

According to embodiments of the present invention, since the flat display panel 10 is transferred while the substrate 50 (instead of the display unit 50a) is adhered to the transfer robot 100, and then the lamination process (using the film lamination apparatus 1000) is performed while the substrate 50 is adhered and fixed to the work table 200, the display unit 50a may be prevented from being damaged by the transfer robot 100 or the work table 200.

Figure 11:
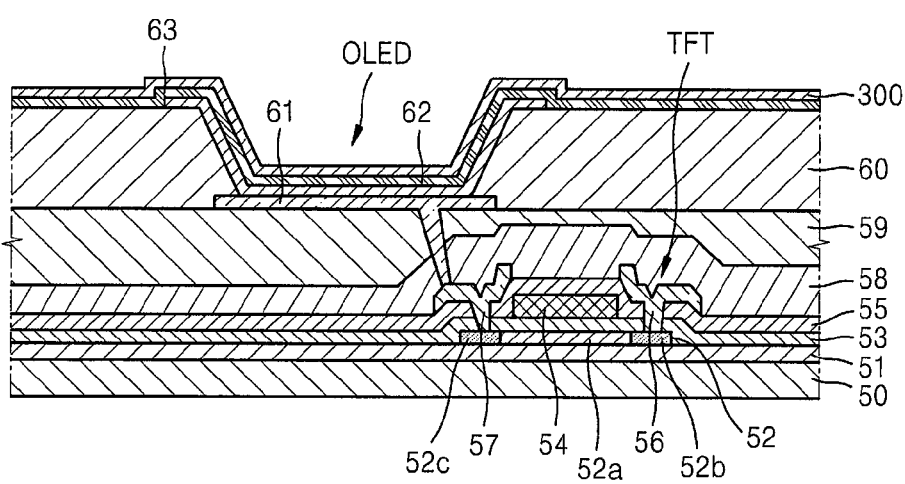
FIG. 11 is a cross-sectional view schematically illustrating an organic light-emitting display apparatus manufactured by using a film lamination apparatus, according to an embodiment of the present invention.

FIG. 11 is a cross-sectional view schematically illustrating an organic light-emitting display apparatus manufactured by using a film lamination apparatus, according to an embodiment of the present invention.

Referring to FIG. 11, the organic light-emitting display apparatus, which is an active matrix type display apparatus, is formed on the substrate 50. The substrate 50 may be formed of a transparent material, such as glass, plastic, or a metal. An insulation film 51, such as a buffer layer, may be formed throughout on the substrate 50.

As shown in FIG. 11, a thin film transistor (TFT) and an organic light-emitting device (OLED) may be formed on the insulation film 51.

A semiconductor active layer 52 may be formed on a top surface of the insulation film 51 in a predetermined pattern. The semiconductor active layer 52 may be embedded in a gate insulation film 53. The semiconductor active layer 52 may include a p- or n-type semiconductor.

In an embodiment, a gate electrode 54 of the TFT is formed on a top surface of the gate insulation film 53 corresponding to the semiconductor active layer 52. Also, an interlayer insulation film 55 is formed to cover the gate electrode 54. After the interlayer insulation film 55 is formed, a contact hole is formed by etching the gate insulation film 53 and the interlayer insulation film 55 via an etching process, such as dry etching, so that a part of the semiconductor active layer 52 is exposed.

Then, source and drain electrodes 56 and 57 may be formed on the interlayer insulation film 55, and may contact the semiconductor active layer 52 through contact holes. A passivation film 58 may be formed to cover the source and drain electrodes 56 and 57, and a part of the drain electrode 57 may be exposed via an etching process. A separate insulation film 59 may be further formed on the passivation film 58 for planarization of the passivation film 58.

According to one or more embodiments of the invention, the OLED displays a suitable (or predetermined) image information by emitting red, green, or blue light according to a flow of current. Here, a first electrode 61 may be formed on the passivation film 58, and the first electrode 61 may be electrically connected to the drain electrode 57 of the TFT.

Also, a pixel-defining film 60 may be formed to cover the first electrode 61. A suitable (or predetermined) opening may be formed in the pixel-defining film 60, and an organic layer 62, including an emission layer, may be formed in a region limited by the predetermined opening. Also, a second electrode 63 may be formed on the organic layer 62.

The pixel-defining film 60 defines each pixel and may be formed of an organic material to even the surface of the substrate 50 where the first electrode 61 is formed, for example, the surface of the passivation layer 58.

The first and second electrodes 61 and 63 are insulated from each other, and the organic layer 62, including the emission layer, emits light by applying voltages having different polarities thereto.

The organic layer 62, including the emission layer, may be formed of a low molecular weight or high molecular weight organic material. When a low molecular weight organic material is used, the organic layer 63 may have a single or complex structure where an HIL, an HTL, an EML, an ETL, and an EIL are stacked on each other. Also, organic materials, such as copper phthalocyanine (CuPc), N,N'-Di(naphthalene-1-yl)-N,N'-diphenyl-benzidine (NPB), and tris-8-hydroxyquinoline aluminum (Alq3) may be used.

After forming the organic layer 63, the second electrode 63 may be formed via the same deposition process.

The first electrode 61 may operate as an anode, and the second electrode 64 may operate as a cathode, or vice versa. Also, the first electrode 61 may be patterned according to each pixel region, and the second electrode 63 may be formed to cover all pixels.

The first electrode 61 may be a transparent electrode or a reflective electrode. When the first electrode 61 is used as a transparent electrode, the first electrode 61 may be formed of indium tin oxide (ITO), indium zinc oxide (IZO), zinc oxide (ZnO), or indium oxide (In2O3), and when the first electrode 61 is used as a reflective electrode, the first electrode 61 may be formed by forming a reflective layer by using silver (Ag), magnesium (Mg), aluminum (Al), platinum (Pt), palladium (Pd), gold (Au), nickel (Ni), neodymium (Nd), iridium (Ir), chromium (Cr), or a compound thereof, and then forming a transparent electrode layer thereon by using ITO, IZO, ZnO, or In3O3. The first electrode 61 may be formed via a sputtering method and then patterned via a photolithography method.

Also, the second electrode 63 may be a transparent electrode or a reflective electrode. When the second electrode 63 is a transparent electrode, the second electrode 63 may be used as a cathode. Accordingly, a metal having a low work function, such as lithium (Li), calcium (Ca), lithium fluoride (LiF)/Ca, LiF/Al, Al, Ag, Mg, or a compound thereof, may be deposited to face the organic layer 62, including the emission layer, and then an auxiliary electrode layer or a bus electrode line may be formed thereon by using ITO, IZO, ZnO, or In2O3. Alternatively, when the second electrode 63 is a reflective electrode, Li, Ca, LiF/Ca, LiF/Al, Al, Ag, Mg, or a compound thereof may be deposited on the entire surface of the organic layer 62. Here, the second electrode 63 may be deposited in the same manner as the organic layer 63.

According to one or more embodiments of the invention, the film 300 is adhered on the second electrode 63. Here, the film 300 is laminated on the second electrode 63 by the film lamination apparatus 1000 described with reference to FIGS. 1 through 10.

The one or more embodiments of the present invention may also be used to deposit an organic layer of an organic TFT or an inorganic film, and may also be applied to a process of forming a film of various materials.

According to the one or more embodiments of the present invention, a display unit of a flat display panel may be prevented from being damaged during a process of laminating a film on the display unit.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A film lamination apparatus for laminating a film on a flat display panel comprising a display unit on one surface of a substrate, the film lamination apparatus comprising:
a work table configured to support the flat display panel such that the display unit is below the substrate; and
a transfer robot configured to support the flat display panel such that the display unit faces upward and to transfer the flat display panel to the work table while the flat display panel is turned over such that the display unit faces downward.

2. The film lamination apparatus of claim 1, wherein the transfer robot comprises:
an arm comprising a plurality of support bars spaced apart from each other and a connector connecting the support bars together at one side of the support bars;
a joint member connected to the arm, the joint member being configured to change a position of the arm; and
first adhesion members on a side of the support bars where the flat display panel is configured to be located, the first adhesion members being configured to adhere to the flat display panel.

3. The film lamination apparatus of claim 2, wherein intervals between adjacent support bars are equal.

4. The film lamination apparatus of claim 2, wherein the arm is rotatable around the joint member.

5. The film lamination apparatus of claim 4, wherein, when the flat display panel is being located on the arm, the arm is configured to be located such that the first adhesion members face upward, and after the first adhesion members adhere to the flat display panel on the arm, the arm is configured to rotate such that the flat display panel faces downward.

6. The film lamination apparatus of claim 2, wherein the transfer robot is configured to rotate the arm such that the display unit faces downward and to transfer the flat display panel to the work table.

7. The film lamination apparatus of claim 2, wherein the joint member is connected to the connector.

8. The film lamination apparatus of claim 2, wherein the joint member is capable of moving the arm up, down, left, or right.

9. The film lamination apparatus of claim 2, wherein a length direction of each of the plurality of support bars is perpendicular to a length direction of the connector.

10. The film lamination apparatus of claim 2, wherein the first adhesion members comprise vacuum pads.

11. The film lamination apparatus of claim 2, wherein the work table comprises:
a body;
a plurality of support ribs on a bottom surface of the body, the support ribs being configured to receive the flat display panel;
a plurality of accommodating portions for respectively accommodating the support bars between the support ribs; and
second adhesion members on one side of the plurality of support ribs, the second adhesion members being configured to secure the flat display panel transferred by the transfer robot.

12. The film lamination apparatus of claim 11, wherein a depth of each of the accommodating portions is larger than a height of each of the plurality of support bars.

13. The film lamination apparatus of claim 11, wherein intervals between the support ribs are larger than widths of the support bars.

14. The film lamination apparatus of claim 11, wherein the support ribs are integrally formed with the body.

15. The film lamination apparatus of claim 11, wherein the support ribs are formed individually from the body and on a bottom surface of the body.

16. The film lamination apparatus of claim 11, wherein the second adhesion members are configured to adhere to and secure the flat display panel to the support ribs after the support bars are respectively accommodated in the accommodating portions.

17. The film lamination apparatus of claim 11, wherein the second adhesion members are configured to adhere to the substrate of the flat display panel when the display unit faces downward.

18. The film lamination apparatus of claim 11, wherein the first adhesion members are configured to release the adhesion with the flat display panel after the second adhesion members adhere to and secure the flat display panel.

19. The film lamination apparatus of claim 18, wherein the transfer robot is configured to move such that the support bars are completely out of the accommodating portions after the flat display panel is secured to the work table by the second adhesion members.

20. The film lamination apparatus of claim 2, wherein the first adhesion members are configured to adhere to and secure the flat display panel on the arm when the flat display panel is on the plurality of support bars, and to release the adhesion with the flat display panel after the flat display panel is transferred to the work table.

21. A method of manufacturing an organic light-emitting display apparatus, the method comprising:
    preparing a flat display panel comprising a display unit on a substrate;
    securing and supporting the flat display panel using a transfer robot such that the display unit is above the substrate;
    rotating the flat display panel such that the display unit is below the substrate;
    securing and supporting the flat display panel to a work table; and
    laminating a film on the display unit.

22. The method of claim 21, wherein the transfer robot comprises:
    an arm comprising a plurality of support bars spaced apart from each other and a connector connecting the support bars together at one side of the support bars;
    a joint member connected to the arm and configured to change a position of the arm; and
    first adhesion members on a side of the support bars where the flat display panel is configured to be located on, the first adhesion members being configured to adhere to the flat display panel.

23. The method of claim 22, wherein the securing and supporting of the flat display panel by using the transfer robot comprises:
    positioning the arm such that the first adhesion members face upward;
    disposing the substrate on the first adhesion members; and
    securing the flat display panel to the arm by adhering the substrate using the first adhesion members.

24. The method of claim 23, wherein the rotating of the flat display panel comprises rotating the flat display panel, when the substrate is adhered to the first adhesion members, by using the arm such that the display unit rotates from facing upward to facing downward.

25. The method of claim 22, wherein the work table comprises:
    a body;
    a plurality of support ribs on a bottom surface of the body and on which the flat display panel is to be placed;
    a plurality of accommodating portions for respectively accommodating the support bars between the support ribs; and
    second adhesion members on one side of the plurality of support ribs, the second adhesion members being configured to secure the flat display panel transferred by the transfer robot.

26. The method of claim 25, wherein a depth of each of the accommodating portions is larger than a height of each of the support bars.

27. The method of claim 25, wherein intervals between the plurality of support ribs are larger than widths of the plurality of support bars.

28. The method of claim 25, wherein the securing and supporting of the flat display panel to the work table comprises:
    ascending the arm supporting the flat display panel towards the work table with the display unit facing downward;
    adhering the substrate by using the second adhesion members;
    releasing the adhesion of the substrate by the first adhesion members; and
    removing the arm from the accommodating portions.

29. The method of claim 28, wherein the ascending of the arm comprises ascending the arm until the second adhesion members contact the substrate and the support bars are accommodated in the accommodating portions.

* * * * *